United States Patent
Jeong et al.

(10) Patent No.: US 10,106,866 B2
(45) Date of Patent: Oct. 23, 2018

(54) MAGNESIUM-ALUMINUM COATED STEEL SHEET

(71) Applicants: POSCO, Pohang-si, Gyeongsangbuk-do (KR); RESEARCH INSTITUTE OF INDUSTRIAL SCIENCE & TECHNOLOGY, Pohang-si, Gyeongsangbuk-do (KR)

(72) Inventors: Jae In Jeong, Pohang-si (KR); Ji Hoon Yang, Pohang-si (KR); Tae Yeob Kim, Pohang-si (KR); Yong Hwa Jung, Pohang-si (KR)

(73) Assignees: POSCO, Pohang-Si, Gyeongsangbuk-Do (KR); RESEARCH INSTITUTE OF INDUSTRIAL SCIENCE & TECHNOLOGY, Pohang-Si, Gyeongsangbuk-Do (KR)

(*) Notice: Subject to any disclaimer, the term of this patent is extended or adjusted under 35 U.S.C. 154(b) by 0 days.

(21) Appl. No.: 15/108,260

(22) PCT Filed: Dec. 17, 2014

(86) PCT No.: PCT/KR2014/012489
§ 371 (c)(1),
(2) Date: Jun. 24, 2016

(87) PCT Pub. No.: WO2015/099354
PCT Pub. Date: Jul. 2, 2015

(65) Prior Publication Data
US 2016/0326607 A1 Nov. 10, 2016

(30) Foreign Application Priority Data
Dec. 24, 2013 (KR) .......................... 10-2013-0163166

(51) Int. Cl.
*C21D 9/46* (2006.01)
*C21D 6/00* (2006.01)
(Continued)

(52) U.S. Cl.
CPC .............. *C21D 9/46* (2013.01); *B32B 15/012* (2013.01); *B32B 15/04* (2013.01); *B32B 15/043* (2013.01);
(Continued)

(58) Field of Classification Search
CPC ....... B32B 15/01; B32B 15/012; B32B 15/04; B32B 15/043; B32B 15/18;
(Continued)

(56) References Cited

U.S. PATENT DOCUMENTS

| 7,998,535 | B2 | 8/2011 | De Meyer et al. | |
| 2012/0295130 | A1* | 11/2012 | Nose | B32B 15/012 428/653 |
| 2013/0186524 | A1* | 7/2013 | Kwak | C23C 2/12 148/531 |

FOREIGN PATENT DOCUMENTS

| CN | 1827859 A | 9/2006 |
| CN | 101033552 A | 9/2007 |

(Continued)

OTHER PUBLICATIONS

Machine Translation, Shinichi et al., JP 2010-070810, Apr. 2010.*
(Continued)

*Primary Examiner* — Michael E. La Villa
(74) *Attorney, Agent, or Firm* — McDermott Will & Emery LLP

(57) ABSTRACT

An exemplary embodiment of the present invention provides a coated steel sheet on which a magnesium-aluminum alloy coating layer is formed, including: a steel sheet; and a coating layer configured to include a first magnesium-
(Continued)

aluminum alloy layer formed on a top surface of the steel sheet and a second magnesium-aluminum alloy layer formed on a top surface of the first magnesium-aluminum alloy layer, wherein a magnesium content of the first magnesium-aluminum alloy layer is higher than that of the second magnesium-aluminum alloy layer.

8 Claims, 6 Drawing Sheets

(51) Int. Cl.
| | |
|---|---|
| C23C 14/28 | (2006.01) |
| C23C 14/58 | (2006.01) |
| C23C 14/16 | (2006.01) |
| B32B 15/01 | (2006.01) |
| C22C 38/00 | (2006.01) |
| C22C 23/02 | (2006.01) |
| C22C 38/04 | (2006.01) |
| C22F 1/047 | (2006.01) |
| B32B 15/18 | (2006.01) |
| B32B 15/04 | (2006.01) |
| C23C 28/02 | (2006.01) |
| C23C 14/02 | (2006.01) |
| C23C 30/00 | (2006.01) |
| C22F 1/06 | (2006.01) |

(52) U.S. Cl.
CPC .............. *B32B 15/18* (2013.01); *C21D 6/005* (2013.01); *C22C 23/02* (2013.01); *C22C 38/002* (2013.01); *C22C 38/04* (2013.01); *C22F 1/047* (2013.01); *C22F 1/06* (2013.01); *C23C 14/022* (2013.01); *C23C 14/025* (2013.01); *C23C 14/027* (2013.01); *C23C 14/16* (2013.01); *C23C 14/165* (2013.01); *C23C 14/28* (2013.01); *C23C 14/5806* (2013.01); *C23C 28/021* (2013.01); *C23C 28/023* (2013.01); *C23C 30/00* (2013.01); *C23C 30/005* (2013.01); *Y10T 428/12729* (2015.01); *Y10T 428/12757* (2015.01); *Y10T 428/12764* (2015.01); *Y10T 428/12972* (2015.01); *Y10T 428/12979* (2015.01); *Y10T 428/2495* (2015.01); *Y10T 428/24942* (2015.01); *Y10T 428/24967* (2015.01); *Y10T 428/263* (2015.01); *Y10T 428/264* (2015.01); *Y10T 428/265* (2015.01)

(58) Field of Classification Search
CPC ... C23C 14/5806; C23C 14/025; C23C 14/16; C23C 14/165; C23C 28/021; C23C 14/28; C23C 14/022; C23C 14/027; C23C 28/023; C23C 30/00; C23C 30/005; C23C 21/06; C22C 23/02; C22C 38/04; C22C 38/002; Y10T 428/12729; Y10T 428/12757; Y10T 428/12764; Y10T 428/12972; Y10T 428/12979; Y10T 428/24942; Y10T 428/2495; Y10T 428/24967; Y10T 428/263; Y10T 428/264; Y10T 428/265
See application file for complete search history.

(56) References Cited

FOREIGN PATENT DOCUMENTS

| | | | |
|---|---|---|---|
| JP | 05-017865 A | | 1/1993 |
| JP | 10-158801 A | | 6/1998 |
| JP | 2003-328105 A | | 11/2003 |
| JP | 2005-537393 A | | 12/2005 |
| JP | 2008-513595 A | | 5/2008 |
| JP | 2010-070810 | * | 4/2010 |
| KR | 10-0711488 B1 | | 4/2007 |
| KR | 10-2012-0075196 A | | 7/2012 |
| KR | 10-2013-0074646 A | | 7/2013 |
| KR | 10-2013-0074647 A | | 7/2013 |
| WO | 2012/091345 A2 | | 7/2012 |
| WO | WO 2012/091345 | * | 7/2012 |

OTHER PUBLICATIONS

International Search Report PCT/KR2014/012489 dated Mar. 4, 2015 with full English translation.
Kang-Geun Park et al., "A Study on the Electrochemical Properties Fabrication Process of Mg—Ca Sacrificial Anode for the Corrosion Protection of Steel Structures", Journal of the Korean Association for Spatial Structures, vol. 6, No. 4, p. 73-80, Dec. 2006, w/English language Abstract.
Office Action issued in corresponding Japanese Patent Application No. 2016-538023, dated May 16, 2017 with English Language translation.
Office Action issued in corresponding Chinese Patent Application No. 201480065205.6, dated Jun. 5, 2017 with English Language translation.

* cited by examiner

[Fig. 4a]
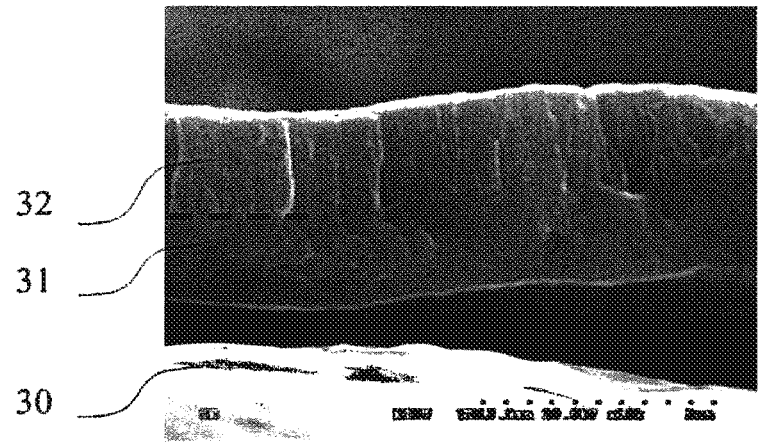
[Fig. 4b]
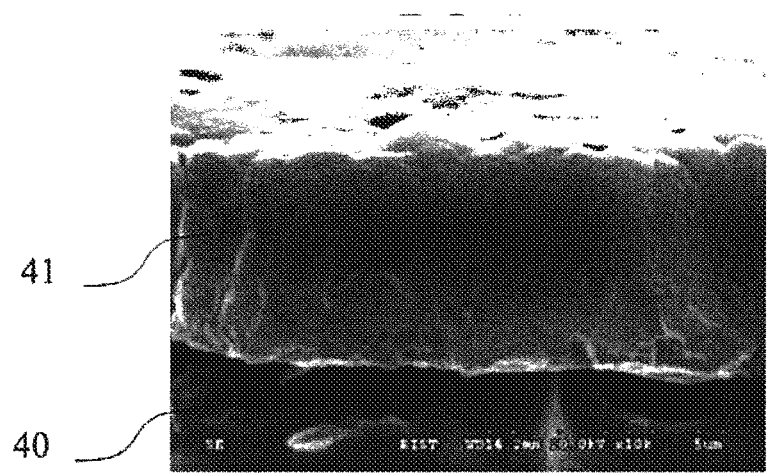

MAGNESIUM-ALUMINUM COATED STEEL SHEET

CROSS-REFERENCE TO RELATED APPLICATIONS

This application is the U.S. National Phase of PCT/KR2014/012489 dated Dec. 17, 2014, which claims priority to Korean Patent Application No. 10-2013-0163166 dated Dec. 24, 2013. The subject matter of each is incorporated herein by reference in entirety.

TECHNICAL FIELD

The present invention relates to a magnesium-aluminum coated steel sheet and a manufacturing method of the steel sheet, and more particularly, to a steel sheet on which a magnesium-aluminum coating layer is formed to prevent corrosion of the steel sheet, and a manufacturing method of the steel sheet.

BACKGROUND ART

Steel is the material that is being used in various industries such as for automobiles, home appliances, and construction thanks to its excellent physical properties. However, since the steel easily reacts with oxygen to cause corrosion, it is essential to perform a surface treatment such as protective layer coating in order to protect against such corrosion.

The steel is processed in various forms such as sheets, rods, and tubes, and a thin steel sheet is one of the most common types of steel products used in the industry. As a method most commonly used to prevent corrosion of the steel sheet, a metal passivation film having higher reactivity with oxygen than iron is coated on a surface of the steel sheet, thereby serving as a sacrificial anode. As a result, the corrosion of the steel sheet is delayed.

Typical examples of the metal employed for such coating of the steel sheet may include zinc and aluminum, and examples of a method of coating such a metal on the steel sheet may include hot dipping and electroplating. Currently, the plating method is being used for most steel sheet surface treatments since it is easy and inexpensive.

When the steel sheet is coated by using a zinc plating method, it can be considered to increase a coating weight of zinc in order to improve corrosion resistance of the steel sheet. However, a method for improving the coating weight of zinc by reducing a plating rate is employed, but this method causes productivity deterioration.

Further, an increase in the coating weight of zinc involves an increase in the weight of the steel sheet with zinc. Accordingly, in the case of transport equipment, the weight increase leads to reduction in fuel consumption efficiency. In addition, natural resources of zinc has been rapidly decreased in recent years, so it is urgently required to discover materials that can replace zinc.

As part of this attempt, a method has been being developed to improve the coating weight of the zinc-plating steel sheet by adding a different kind of element without increasing the coating weight of zinc. Examples of the different kind of element may include aluminum and magnesium.

DISCLOSURE

Technical Problem

The present invention has been made in an effort to provide a steel sheet on which a magnesium-aluminum coating layer that is obtained by using aluminum having an excellent film appearance characteristic and magnesium having an excellent sacrificial protection characteristic is formed and having a concentration gradient for a total magnesium content, which are used as metals for preventing corrosion of the steel sheet, and a manufacturing method of the steel sheet.

A side of the coating layer having a low concentration is used as a sacrificial anode by a concentration gradient difference of magnesium, and thus it is possible to realize a passivation film having excellent corrosion resistance and a good appearance by appropriately adjusting the composition of magnesium and aluminum.

Technical Solution

An exemplary embodiment of the present invention provides a coated steel sheet on which a magnesium-aluminum alloy coating layer is formed, including: a steel sheet; and a coating layer configured to include a first magnesium-aluminum alloy layer formed on a top surface of the steel sheet and a second magnesium-aluminum alloy layer formed on a top surface of the first magnesium-aluminum alloy layer, wherein a magnesium content of the first magnesium-aluminum alloy layer is higher than that of the second magnesium-aluminum alloy layer.

In this case, the magnesium content of the first magnesium-aluminum alloy layer may be in a range of 20 to 95 wt %, and the magnesium content of the second magnesium-aluminum alloy layer may be in a range of 5 to 40 wt %.

A total magnesium content of the coating layer formed by the first magnesium-aluminum alloy layer and the second magnesium-aluminum alloy layer may be equal to or greater than 12.5 wt %.

Each of the first magnesium-aluminum alloy layer and the second magnesium-aluminum alloy layer may have a thickness in a range of 0.5 to 30 µm, and a total thickness of the coating layer formed on the steel sheet by the first magnesium-aluminum alloy layer and the second magnesium-aluminum alloy layer may be in a range of 1 to 50 µm.

A total thickness of the coating layer formed on the steel sheet by the first magnesium-aluminum alloy layer and the second magnesium-aluminum alloy layer may be equal to or smaller than 5 µm.

The coating layer may contain a mixture of α-phase and β-phase $Al_3Mg_2$.

In this case, a part or all of the coating layer may be formed to have a crystal grain shape, each of the α-phase and the β-phase $Al_3Mg_2$ may form crystal grains, and an average size of the crystal grains is in a range 0.1 to 2 µm.

An area ratio of β-phase/α-phase of the coating layer crystal grain may be in a range of 10 to 70%, and a ratio of α- and β-phases may be in a range of 0.01 to 1.5 as an XRD intensity ratio, which is $I\beta(880)/I\alpha(111)$.

Another exemplary embodiment of the present invention provides method of forming a magnesium-aluminum alloy coating layer on a steel sheet, including: preparing a steel sheet; forming a first magnesium-aluminum alloy layer by vacuum-depositing a magnesium-aluminum alloy source on a top surface of the steel sheet one or more times; and forming a second magnesium-aluminum alloy layer by vacuum-depositing a magnesium-aluminum alloy source on a top surface of the first magnesium-aluminum alloy layer one or more times, wherein a magnesium content of the first magnesium-aluminum alloy layer is higher than that of the second magnesium-aluminum alloy layer.

Herein, a pure magnesium source and a pure aluminum source may be employed instead of the magnesium-aluminum alloy source.

The magnesium content of the first magnesium-aluminum alloy layer may be in a range of 20 to 95 wt %, and the magnesium content of the second magnesium-aluminum alloy layer may be in a range of 5 to 40 wt %.

A total magnesium content of a coating layer formed by the first magnesium-aluminum alloy layer and the second magnesium-aluminum alloy layer may be equal to or greater than 12.5 wt %.

The first magnesium-aluminum alloy layer may be vacuum-deposited on the steel sheet to have a thickness in which aluminum included in the first magnesium-aluminum alloy layer is diffused so that reacts with iron on the steel sheet to form an iron-aluminum alloy layer on the first magnesium-aluminum alloy layer.

Each of the first magnesium-aluminum alloy layer and the second magnesium-aluminum alloy layer may have a thickness in a range of 0.5 to 30 μm.

In this case, a total thickness of a coating layer formed on the steel sheet by the first magnesium-aluminum alloy layer and the second magnesium-aluminum alloy layer may be in a range of 1 to 50 μm.

A total thickness of the coating layer formed on the steel sheet by the first magnesium-aluminum alloy layer and the second magnesium-aluminum alloy layer may be equal to or smaller than 5 μm.

The first and second magnesium-aluminum alloy layers may be vacuum-deposited by magnetron sputtering.

In this case, the first and second magnesium-aluminum alloy layers may be vacuum-deposited by repeatedly reciprocating or rotating a magnesium-aluminum alloy source or an aluminum source, or the steel sheet disposed over a magnesium source.

Herein, the magnesium content of the first and second magnesium-aluminum alloy layers may be controlled by adjusting a current or a voltage applied to the source.

Phase transformation may be carried out by performing a heat treatment on the steel sheet on which the first and second magnesium-aluminum alloy coating layers are formed in a heat treatment furnace.

In this case, the heat treatment may be performed in an inert atmosphere in a temperature range of 350 to 600° C. for 2 to 10 min.

One or more of an iron-aluminum alloy layer and a magnesium-aluminum alloy layer may be formed from the first and second magnesium-aluminum alloy coating layers by the heat treatment.

One or more of α-phase and β-phase $Al_3Mg_2$ may be formed from the first and second magnesium-aluminum alloy coating layers by the heat treatment.

Advantageous Effects

According to the exemplary embodiments of the present invention, the steel sheet including a magnesium-aluminum alloy coating layer in which the magnesium concentration gradient is formed can have a thickness that is thinner than that of a zinc-plating layer of a conventional zinc-plating steel sheet, can have corrosion resistance that is equal to or higher than that of the zinc-plating steel sheet, and can realize good color and appearance.

According to the exemplary embodiments of the present invention, the steel sheet including a magnesium-aluminum alloy coating layer in which the magnesium concentration gradient is formed can perform sacrificial protection by galvanic coupling two magnesium-aluminum alloy layers having a magnesium concentration gradient to use a potential difference between the alloy layers, thereby accomplishing excellent corrosion resistance.

According to the exemplary embodiments of the present invention, the steel sheet including a magnesium-aluminum alloy coating layer in which the magnesium concentration gradient is formed can accomplish an excellent corrosion resistance characteristic and a good surface appearance by containing aluminum having an excellent surface color characteristic.

In addition, according to the exemplary embodiments of the present invention, the steel sheet including a magnesium-aluminum alloy coating layer in which the magnesium concentration gradient is formed can improve a corrosion resistance characteristic by the heat treatment and maintain a good surface appearance.

DESCRIPTION OF THE DRAWINGS

FIG. 4a is a scanning electron microscope photograph according to Example 1 of the present invention.

FIG. 4b is a scanning electron microscope photograph according to Example 2 of the present invention.

MODE FOR INVENTION

Figure 1:
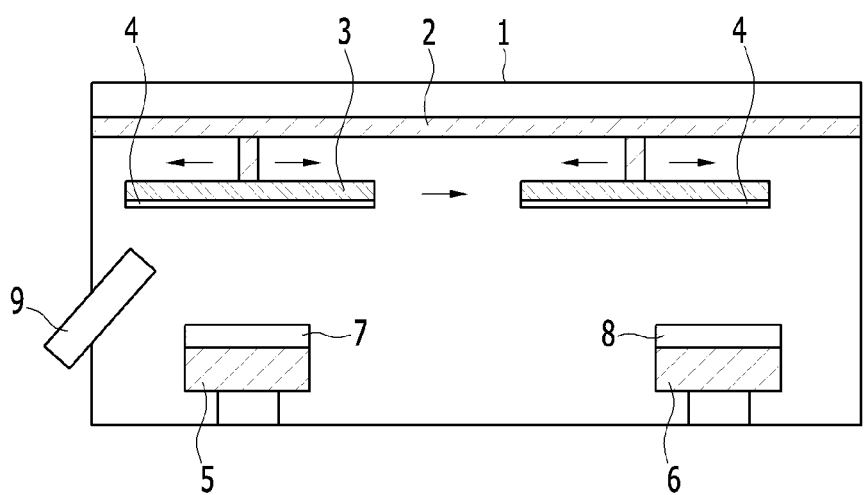
FIG. 1 is a schematic diagram illustrating a vacuum coating apparatus used to deposit a magnesium-aluminum alloy layer on a steel sheet according to an exemplary embodiment of the present invention.

Advantages and features of the present invention and methods to achieve them will be elucidated through exemplary embodiments described below in detail with reference to the accompanying drawings.

However, exemplary embodiments introduced herein are provided to make disclosed contents thorough and complete and sufficiently transfer the spirit of the present invention to those skilled in the art. Therefore, the present invention will be defined only by the scope of the appended claims.

According to an exemplary embodiment of the present invention, a coated steel sheet on which a magnesium-aluminum alloy coating layer is formed is obtained by depositing a plurality of magnesium-aluminum alloy layers having different magnesium contents on a top surface of a steel sheet. In this case, the magnesium concentration of a first one of the magnesium-aluminum alloy layers that is closer to the steel sheet is higher than that of a second one that is relatively distant from the steel sheet.

The magnesium-aluminum alloy layers generally constitute one coating layer on the steel sheet, and a crystalline structure of the coating layer is subjected to phase transformation by performing a heat treatment on the coating layer, thereby further increasing corrosion resistance.

Herein, the magnesium-aluminum alloy layers are subjected to galvanic coupling by differently adjusting the magnesium contents of the alloy layers, and thus the outer alloy layer acts as a sacrificial protective layer.

Further, in the present exemplary embodiment, the magnesium-aluminum alloy coating layer contains aluminum having a weak sacrificial protective characteristic. However, the weak sacrificial protective characteristic is strengthened by magnesium so that a surface color of aluminum itself can be vividly demonstrated.

As described above, a plurality of magnesium-aluminum alloy layers may be deposited on a steel sheet for a coated steel sheet on which a magnesium-aluminum alloy coating layer is formed. However, for convenience of description, a case that two alloy layers are deposited thereon will be mainly described hereinafter.

According to the exemplary embodiment of the present invention, a magnesium content of a first magnesium-aluminum alloy layer that is firstly deposited on a steel sheet may be in a range of 20 to 95 wt %.

This confinement of the magnesium content of the first alloy layer is because the sacrificial protective characteristic is deteriorated in case of the magnesium content of less than 20 wt % and a characteristic improving effect caused by alloying disappears in the case of more than 95 wt %.

Further, a magnesium content of a second magnesium-aluminum alloy layer that is firstly deposited on the first alloy layer may be in a range of 5 to 40 wt %.

This confinement of the magnesium content of the second alloy layer is because the characteristic improving effect caused by alloying disappears in case of the magnesium content of less than 5 wt % and durability of a coating surface is deteriorated in the case of more than 40 wt %.

A total magnesium content of a coating layer formed by the first magnesium-aluminum alloy layer and the second magnesium-aluminum alloy layer may be equal to or greater than 12.5 wt %. This confinement of the total content of the coating layer is because a sacrificial protective characteristic of the coating layer is deteriorated in the case of the magnesium content of less than 12.5 wt %.

Each thickness of the first magnesium-aluminum alloy layer and the second magnesium-aluminum alloy layer may be in a range of 0.5 to 30 μm. This is because the corrosion resistance is not sufficiently obtained in the case of the thickness of less than 0.5 μm and a thin film is peeled off by increased stress in the case of more than 30 μm.

A total thickness of the coating layer formed on the steel sheet by the first magnesium-aluminum alloy layer and the second magnesium-aluminum alloy layer may be in a range of 1 to 50 μm, or may be equal to or smaller than 5 μm.

Hereinafter, a process of constituting one coating layer by forming a plurality of magnesium-aluminum alloy layers on a steel sheet will be described.

FIG. 1 is a schematic diagram illustrating a vacuum coating apparatus used to deposit a magnesium-aluminum alloy layer on a steel sheet according to an exemplary embodiment of the present invention.

In the present exemplary embodiment, for example, a vacuum coating method may be used to coat the magnesium-aluminum alloy layers on the steel sheet. As compared with previous plating methods, even though the vacuum coating method has a higher cost, the vacuum coating method has more competitive productivity since a coating layer having a thin thickness can be quickly manufactured.

In the present exemplary embodiment, for example, a cold rolled steel sheet may be employed as a substrate on which the magnesium-aluminum alloys are coated. The cold rolled steel sheet may be formed of low carbon steel having a carbon content of 0.3 wt %, and may be used for a steel sheet for a vehicle, a home appliance, or a construction material.

Further, a plasma vacuum deposition method may be employed to form the magnesium-aluminum alloy layers. In this case, a deposition source used for the plasma vacuum deposition method is a magnesium-aluminum alloy, and a plurality of deposition sources may be provided. In the deposition method, the magnesium-aluminum alloy deposition sources are simultaneously mounted in a deposition device and are operated by applying a current or a voltage thereto. In this state, a substrate that is movably installed at an upper portion thereof reciprocates or rotates over a sputtering source to form a coating layer.

First, a first alloy evaporation source 5 and a second alloy evaporation source 6 are installed at a bottom portion of a vacuum chamber 1 in the deposition device, and a substrate holder 3 for mounting a substrate 4 therein and transporting the substrate 4 is disposed at a top portion of the vacuum chamber 1. Herein, the substrate holder 3 is configured to move left and right by a substrate transport guide 2. Further, a linear ion beam source 9 may be mounted at a side surface of the vacuum chamber 1 to purify the substrate 4.

The first alloy evaporation source 5 and the second alloy evaporation source 6 for generating magnesium-aluminum alloy vapors are respectively attached to magnesium-aluminum alloy targets 7 and 8 having different components and contents, and thus the alloy vapors are coated on the substrate 4.

Hereinafter, a process of coating a magnesium-aluminum alloy layer on a surface of the substrate 4 by using the vacuum deposition device will be described.

First, a first alloy target 7 and a second alloy target 8 are respectively installed in the first alloy evaporation source 5 and the second alloy evaporation source 6, and the substrate 4 is mounted in the substrate holder 3. Then, the substrate 4 is located over the first alloy evaporation source 5, and the vacuum chamber 1 is exhausted to a vacuum level of $10^{-5}$ torr or less by using a vacuum pump (not illustrated). When the exhaust is completed, the substrate 4 is purified by using the linear ion beam source 9. Then, the substrate 4 is coated with a lower layer by generating plasma in the first alloy evaporation source 5. Further, the substrate 4 is located over the second alloy evaporation source 6, and then the substrate 4 is coated with an upper layer by generating plasma in the second alloy evaporation source 6.

In the aforementioned exemplary embodiment, the magnesium-aluminum alloy has been taken as an example of the deposition source used to deposit a magnesium-aluminum alloy coating layer, but the present invention is not limited thereto. Alternatively, a pure magnesium source and a pure aluminum source may be simultaneously installed. In this state, the magnesium-aluminum alloy layer may be deposited on the substrate 4 by reciprocating the substrate 4.

A method of depositing a dual magnesium-aluminum alloy layer on a substrate 14 by using pure magnesium and pure aluminum as deposition sources will be described with reference to FIG. 2.

First, an aluminum target 17 having purity of 99.995% is mounted to an aluminum evaporation source 15, and a magnesium target 18 having purity of 99.99% is mounted to a magnesium evaporation source 16. Then, the two evaporation sources 15 and 16 are adjacently installed in parallel.

Next, the substrate 14 formed of a cold rolled steel sheet is mounted to a substrate holder 13 and evacuation is performed. When a vacuum level arrives in $10^{-5}$ torr or less, the substrate 14 is located over the linear ion beam source 19 to purify the substrate 14. Then, impurities and oxide films on the substrate 14 are removed by a linear ion beam source 19.

The purification of the substrate 14 may be performed in an argon gas atmosphere while the substrate 14 is moved left and right by using a substrate transport guide 12 in a state in which ion beams are controlled.

When the purifying of the substrate 14 is completed, the substrate 14 is located over the two evaporation sources 15 and 16 by using the substrate transport guide 12, and the substrate 14 is coated with the dual magnesium-aluminum alloy layer by applying power to each of the aluminum evaporation source 15 and the magnesium evaporation source 16 to generate plasmas in the two evaporation sources 15 and 16.

In this case, the substrate 14 is continuously moved left and right over the two evaporation sources 15 and 16 to coat aluminum and magnesium thereon. As a result, the magnesium content of the magnesium-aluminum alloy layers can be controlled.

A heat treatment may be performed on the steel sheet coated with such magnesium-aluminum alloy layers in a vacuum heat treatment furnace.

As the vacuum heat treatment furnace, a heat treatment furnace formed by connecting a preheating furnace, a heat treatment furnace, and a soaking pit in series may be used. In this case, barrier films may be formed in the preheating furnace, the heat treatment furnace, and the soaking pit to define spaces of each furnace, and holes may be formed in the barrier films to move the steel sheet.

This heat treatment furnace may be exhausted to a vacuum level, and an inert gas, e.g., nitrogen gas, may be supplied as an atmosphere gas.

In order to perform the heat treatment of the coated steel sheet on which the magnesium-aluminum alloy coating layers are formed, the steel sheet is placed into the preheating furnace and is heated to a heat treatment temperature such that the temperature of the steel sheet is in a stabilized state, and is moved to the heat treatment furnace.

The heat treatment of the coated steel sheet on which the magnesium-aluminum alloy coating layers are formed may be formed in a temperature range of 350 to 600° C. for 2 to 10 min. If the heat treatment is performed at a temperature of less than 350° C. or for less than 2 min, each component is not sufficiently diffused in the magnesium-aluminum alloy layer so that insufficient magnesium-aluminum alloys are obtained. If the heat treatment is performed at a temperature of more than 600° C. or for more than 10 min, stress of the coating layers is increased to peel off the coating layers.

For example, the heat treatment may be performed at 350° C. for 10 min, or may be performed at 400° C. for 4 min.

When the heat treatment is performed on the coated steel sheet on which the magnesium-aluminum alloy coating layers are formed, an iron component is diffused to the coating layer at an interface between the coated steel and the coating layer to form an $Al_xFe_y$ layer, and is phase-changed to the magnesium-aluminum alloy layer in the magnesium-aluminum alloy coating layers.

In this case, in the $Al_xFe_y$ layer, x may be in a range of 1 to 3, and y may be in a range of 0.5 to 1.5. A thickness of the AlxFey layer may be in a range of 0.2 to 1 μm.

In the $Al_xFe_y$ layer, x and y determine brittleness of Al—Fe alloys, and have such ranges so as to not form Al—Fe alloys having poor mechanical characteristics (e.g., $FeAl_2$, $Fe_2Al_5$, $FeAl_3$, and the like). The Al—Fe alloys (e.g., $Fe_3Al$, FeAl, and the like) having the range of x from 1 to 3 and the range of y from 0.5 to 1.5 improve adhesion between the steel sheet and the magnesium-aluminum alloy layers. Accordingly, x and y are limited to these ranges.

Further, the reason that the layer thickness of the Al—Fe alloys is limited to 0.2 to 1 μm is as follows. When the thickness of the Al—Fe layer is increased, Al may be relatively limited, and the Fe content may be increased to form an Al—Fe alloy having brittleness, thereby deteriorating the mechanical characteristic of the coating layer.

In this case, an $Al_xFe_y$ layer formed at an interface between the steel sheet and the coating layer is an aluminum-iron alloy layer containing a small amount of magnesium. This $Al_xFe_y$ layer may be formed to have a thickness that is in a range of 1 to 50% of the thickness of the magnesium-aluminum coating layer from the steel sheet toward the coating layer.

The reason that the thickness of the AlxFey layer is limited to 1 to 50% of the thickness of the coating layer is as follows. If the thickness of the $Al_xFe_y$ layer exceeds 50% of the thickness of the coating layer, the Fe content may be increased, thereby forming an alloy having a poor mechanical characteristic.

Further, the magnesium-aluminum alloy layer is phase-changed by the heat treatment in a state in which α and β phases are mixed. Herein, the α-phase indicates an aluminum phase of a face-centered cubic lattice (FCC), and the β-phase indicates $Al_3Mg_2$ of the face-centered cubic lattice. In the magnesium-aluminum alloy layer, a ratio of α- and β-phases may be in a range of 0.01 to 1.5 by an XRD intensity ratio, i.e., Iβ(880)/Iα(111).

The reason that the ratio of α- and β-phases are determined as the range of 0.01 to 1.5 by Iβ/Iα is as follows. When a heat treatment is performed on a Mg—Al coating layer, an XRD peak intensity of a Mg—Al alloy (β-phase) is varied depending on a Mg content, and thus the reason is to limit the content of Mg for generating the β-phase.

Further, the magnesium-aluminum alloy layer phase-changed by the heat treatment forms crystal grains such as columnar crystals. These crystal grains have a size which is in a range of 0.2 to 1 μm.

The reason that the size of the crystal grains is limited to the range of 0.2 to 1 μm is as follows. When the size of the crystal grains is smaller than 0.2 μm, it is not easy to form the crystal grains by adjusting a heat treatment condition. When the size of the crystal grains exceeds 1 μm, the crystal grains are divided into Al—Fe layers and Mg layers.

In the case of the crystal grains of the magnesium-aluminum alloy layer, an area ratio of β-phase/α-phase may be in a range of 10 to 70%.

The reason that the area ratio of β-phase/α-phase is in the range of 10 to 70% is as follows. When the area ratio of β-phase/α-phase exceeds the range of 10 to 70%, the Mg—Al alloy (β-phase) is not formed.

Hereinafter, examples and comparative examples of the present invention will be described.

Herein, all steel sheets employed in the examples and comparative examples were steel sheets containing carbon C (0.12 wt % or less excluding 0%), manganese (Mn) (0.50 wt % or less excluding 0%), phosphorus (P) (0.04 wt % or less excluding 0%), and sulfur (S) (0.040 wt % or less excluding 0%), and remaining iron (Fe) and other inevitable impurities, which are subjected to hot rolling and cold rolling to have a thickness of 0.8 mm.

Example 1

A cold rolled steel sheet having a width of 300 mm, a length of 300 mm, and a thickness of 0.8 mm was employed as the substrate 4 in the vacuum chamber 1 of the deposition device described in FIG. 1.

At the bottom portion of the vacuum portion of the deposition device, the first alloy target 7 containing magnesium (20 wt %) and aluminum (80 wt %) and the second alloy target 8 containing magnesium (5 wt %) and aluminum (95 wt %) were respectively mounted to the first alloy evaporation source 5 and the second alloy evaporation source 6.

In this state, the vacuum chamber 1 was exhausted to a vacuum level of $10^{-5}$ torr or less, and the substrate 4 was purified by removing impurities and oxide films thereon by using the linear ion beam source 9.

In this case, the purification of the substrate 4 was performed while reciprocated left and right four times by adjusting ion beam conditions to 3 kV and 400 mA and using the substrate transport guide 2 to move the substrate 4 left and right.

As described above, the purification of the substrate 4 was completed, and then a first alloy layer was deposited on a top surface of the substrate 4 to have a deposition thickness of 2.5 µm by applying power of 5 kW to the first alloy evaporation source 5.

Next, the substrate 4 was moved to the second alloy evaporation source 6, and then a second alloy layer was deposited on a top surface of the first alloy layer to have a deposition thickness of 2.5 µm thickness such that a total thickness of the two alloy layers reached 5 µm by applying power of 5.5 kW to the second alloy evaporation source 6.

Example 2

In Example 2, a specimen obtained by successively depositing a first magnesium-aluminum alloy layer and a second magnesium-aluminum alloy layer on a cold rolled steel sheet according to Example 1 was placed into a heat treatment furnace, and was then subjected to a heat treatment in a nitrogen atmosphere at a temperature of 400° C. for 10 min.

Example 3

Figure 2:
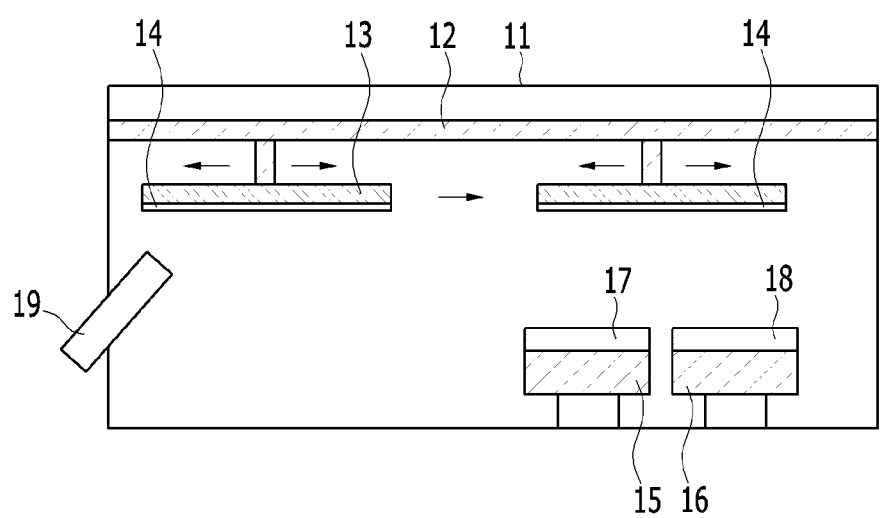
FIG. 2 is a schematic diagram illustrating a vacuum coating apparatus which deposits a dual magnesium-aluminum alloy layer on a substrate by using pure magnesium and pure aluminum as deposition sources according to another exemplary embodiment of the present invention.

In Example 3, a coating layer was formed by successively depositing a first magnesium-aluminum alloy layer and a second magnesium-aluminum alloy layer with the deposition device described in FIG. 2.

Herein, single metal targets of aluminum and magnesium were employed as deposition sources instead of using magnesium-aluminum alloys.

In this case, an aluminum metal having purity of 99.995% and a magnesium metal having purity of 99.99% were respectively employed as an aluminum evaporation source and a magnesium evaporation source.

The aluminum target 17 and the magnesium target 18 were respectively mounted to such aluminum and magnesium evaporation sources, and were then adjacently installed in parallel.

Meanwhile, a same cold rolled steel sheet as that of Example 1 was employed as the substrate 14.

Next, the vacuum chamber 11 was evacuated in a state in which the substrate 14 and the deposition targets 17 and 18 were mounted. When the vacuum level reached $10^{-5}$ torr or less, impurities and oxide films on the substrate 14 were removed by using the linear ion beam source 19 to purify the substrate 14.

In this case, the purification of the substrate 14 was performed while reciprocated left and right four times after adjusting ion beam conditions to 3 kV and 400 mA and using the substrate transport guide 12 to move the substrate 14 left and right.

As described above, the purification of the substrate 14 was completed, and then the substrate 14 was moved over the two evaporation sources by using the substrate transport guide 12. Then, a first magnesium-aluminum alloy layer was coated on the substrate 14 by respectively applying 8 kW and 3 kW to the aluminum evaporation source 15 and the magnesium evaporation source 16 to simultaneously generate plasmas therein.

In this case, the substrate 14 was continuously moved left and right over the two evaporation sources 15 and 16 to alternately coat aluminum and magnesium such that a magnesium content of the first magnesium-aluminum alloy layer was adjusted to 40 wt %. In this case, a thickness of the first magnesium-aluminum alloy layer was 2.5 µm.

As described above, the first magnesium-aluminum alloy layer was deposited on the substrate 14, and then the second magnesium-aluminum alloy layer was successively deposited thereon.

As a deposition condition of the second magnesium-aluminum alloy layer, the power of the magnesium evaporation source 16 was reduced to 1 kW such that the magnesium content of the second magnesium-aluminum alloy layer reached 10 wt %. In this case, the thickness of the second magnesium-aluminum alloy layer was 2.5 µm.

Accordingly, a total thickness of the first and second magnesium-aluminum alloy layers become 5 µm.

Example 4

In Example 4, a specimen obtained by successively depositing a first magnesium-aluminum alloy layer and a second magnesium-aluminum alloy layer on a cold rolled steel sheet according to Example 3 was placed into a heat treatment furnace, and was then subjected to a heat treatment in a nitrogen atmosphere at a temperature of 400° C. for 10 min.

Comparative Example 1

Comparative Example 1 was performed under the same conditions as those of Example 3, except that aluminum (100 wt %) was vacuum-deposited on the substrate 14 to have a thickness of 5 µm.

Comparative Example 2

In Comparative Example 2, pure zinc was coated on the cold rolled steel sheet employed in Examples 1 to 4 to have a thickness of 5.6 µm.

Comparative Example 3

Comparative Example 3 was performed under the same conditions as those of Example 1, except that a single magnesium-aluminum alloy layer was vacuum-deposited on a cold rolled steel sheet to have a thickness of 5 µm without forming a concentration gradient of magnesium, i.e., the first and second magnesium-aluminum alloy layers, thereon.

Hereinafter, test results of Examples 1 to 4 and Comparative Examples 1 to 3 will be described with reference to FIG. 3 to FIG. 5.

Figure 3A:
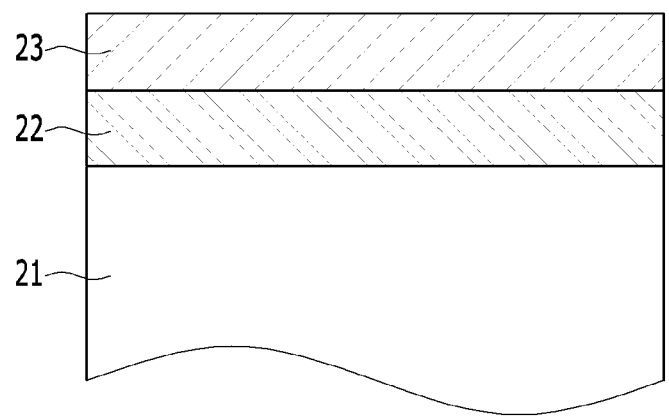
FIG. 3a is a schematic view illustrating a first coating layer and a second coating layer deposited on a cold rolled steel sheet according to Example 1 and Example 3 of the present invention.
Figure 3B:
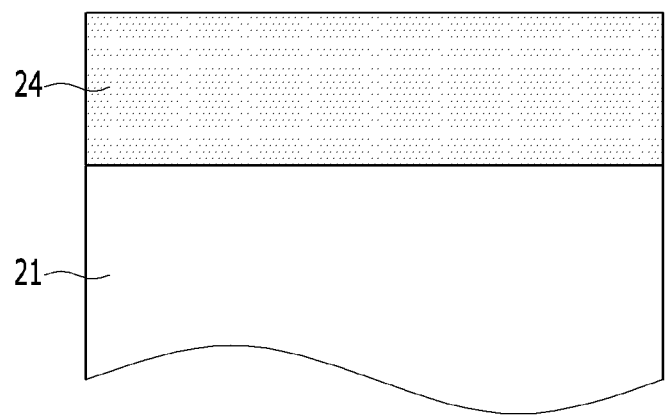
FIG. 3b is a schematic view illustrating heat treatment results according to Example 2 and Example 4 of the present invention.

FIG. 3a is a schematic view illustrating a first coating layer and a second coating layer deposited on a cold rolled steel sheet according to Example 1 and Example 3 of the present invention. FIG. 3b is a schematic view illustrating heat treatment results according to Example 2 and Example 4 of the present invention.

As shown in FIG. 3a, in Example 1 and Example 3, a first Mg—Al alloy layer 22 and a second Mg—Al alloy layer 23 are deposited on a steel sheet 21 to have a clear interface between a lower layer and an upper layer.

However, as a heat treatment is performed on such first and second Mg—Al alloy coating layers, magnesium and aluminum of each layer are mutually diffused to form a so-called magnesium concentration gradient (inclination) layer 24 at which the magnesium content is gradually increased from top to bottom as shown in FIG. 3b.

For comparison, FIG. 4a illustrates a photograph of a crystalline structure in which the first Mg—Al alloy layer 22 and the second Mg—Al alloy layer 23 are formed after being deposited according to Example 1, and FIG. 4b illustrates a photograph of the crystalline structure after being subjected to the heat treatment according to Example 2.

As shown in FIG. 4a illustrating a scanning electron microscope photograph according to Example 1, two alloy layers 31 and 32 are clearly formed on a top surface of a steel sheet 30. In FIG. 4a, reference numeral 31 indicates a first Mg—Al alloy layer, and reference numeral 32 indicates a second Mg—Al alloy layer. Further, as shown in FIG. 4a, in the case of the first Mg—Al alloy layer 31, crystal growth is not clear and a crystalline structure is densely formed. However, in the case of the second Mg—Al alloy layer 32, a columnar crystalline structure is developed.

This phenomenon occurs because the crystal growth structure is varied depending on the magnesium content in an alloy deposition layer.

FIG. 4b, which is a scanning electron microscope photograph according to Example 2, illustrates a phenomenon in which two alloy layers deposited on a steel sheet 40 are combined as one coating layer 41 as an interface therebetween disappears. This phenomenon is determined to occur because components of the first and second Mg—Al alloy layers deposited on the steel sheet 40 are mutually diffused to one layer through the heat treatment. A so-called magnesium concentration gradient (inclination) layer 24 at which the magnesium content is gradually increased from an upper portion of the coating layer 41 toward a substrate is thereby formed.

Figure 5:
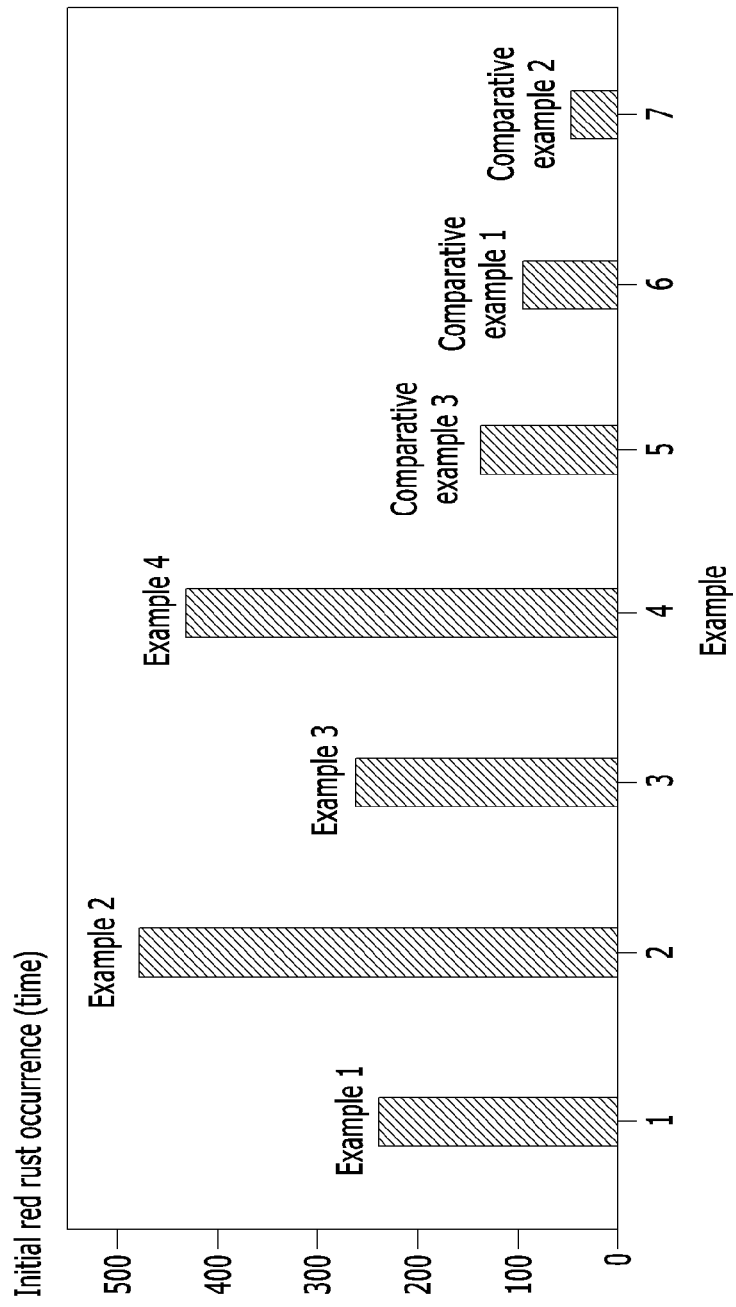
FIG. 5 is a graph illustrating evaluations of corrosion resistance according to Examples 1 to 4 and Comparative Examples 1 to 3 of the present invention.

FIG. 5 is a graph illustrating evaluations of corrosion resistance according to Examples 1 to 4 and Comparative Examples 1 to 3 of the present invention.

Such corrosion resistance evaluations were performed based on an initial red rust occurrence time by using a salt spray test (ASTM B-117).

As shown in FIG. 5, in the case of red rust occurrence time, Comparative Example 1 is 72 h, and Comparative Example 2 is 48 h. However, no red rust occurs for at least 200 h in Example 1 to Example 4. As a result, the steel sheets according to Example 1 to Example 4 show high corrosion resistance. Particularly, Example 2 and Example 4 in which the heat treatment is performed show excellent corrosion resistance since no red rust occurs for 400 hours or more.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

DESCRIPTION OF SYMBOLS

| | |
|---|---|
| 1, 11: vacuum chamber | 2, 12: substrate transport guide |
| 3, 13: substrate holder | 4, 14: substrate |
| 5: first alloy evaporation source | 6: second alloy evaporation source |
| 7: first alloy target | 8: substrate transport guide |
| 9, 19: ion beam source | 15: aluminum evaporation source |
| 16: magnesium evaporation source | 17: aluminum target |
| 18: magnesium target | |

The invention claimed is:

1. A coated steel sheet on which a magnesium-aluminum alloy coating layer is formed, the coated steel sheet comprising:
   a steel sheet; and
   a coating layer configured to include a first magnesium-aluminum alloy layer formed on a top surface of the steel sheet and a second magnesium-aluminum alloy layer formed on a top surface of the first magnesium-aluminum alloy layer,
   wherein a magnesium content of the first magnesium-aluminum alloy layer as a wt % of the first magnesium-aluminum alloy layer is higher than that of the second magnesium-aluminum alloy layer as a wt % of the second magnesium-aluminum alloy layer,
   wherein the second magnesium-aluminum alloy layer contains columnar crystals,
   wherein the magnesium content of the first magnesium-aluminum alloy layer is in a range of 20 to 95 wt %, and the magnesium content of the second magnesium-aluminum alloy layer is in a range of 5 to 40 wt %,
   wherein a total magnesium content of the coating layer formed by the first magnesium-aluminum alloy layer and the second magnesium-aluminum alloy layer is equal to or greater than 12.5 wt %, and
   wherein each of the first magnesium-aluminum alloy layer and the second magnesium-aluminum alloy layer has a thickness in a range of 0.5 to 30 μm.

2. The coated steel sheet of claim 1, wherein a total thickness of the coating layer formed on the steel sheet by the first magnesium-aluminum alloy layer and the second magnesium-aluminum alloy layer is in a range of 1 to 50 μm.

3. The coated steel sheet of claim 1, wherein a total thickness of the coating layer formed on the steel sheet by the first magnesium-aluminum alloy layer and the second magnesium-aluminum alloy layer is equal to or smaller than 5 μm.

4. A coated steel sheet on which a magnesium-aluminum alloy coating layer is formed, the coated steel sheet comprising:
   a steel sheet; and
   a coating layer configured to include a first magnesium-aluminum alloy layer formed on a top surface of the steel sheet and a second magnesium-aluminum alloy layer formed on a top surface of the first magnesium-aluminum alloy layer,
   wherein a magnesium content of the first magnesium-aluminum alloy layer as a wt % of the first magnesium-aluminum alloy layer is higher than that of the second magnesium-aluminum alloy layer as a wt % of the second magnesium-aluminum alloy layer, and wherein the coating layer contains a mixture of α-phase Al and β-phase $Al_3Mg_2$.

5. The coated steel sheet of claim 4, wherein a part or all of the coating layer is formed to have a crystal grain shape.

6. The coated steel sheet of claim 5, wherein each of the α-phase Al and the β-phase $Al_3Mg_2$ forms crystal grains, and an average size of the crystal grains is in a range of 0.1 to 2 μm.

7. The coated steel sheet of claim 6, wherein an area ratio of β-phase/α-phase of the coating layer crystal grain is in a range of 10 to 70%.

8. The coated steel sheet of claim 7, wherein a ratio of α- and β-phases is in a range of 0.01 to 1.5 as an XRD intensity ratio, which is $Iβ(880)/Iα(111)$.

* * * * *